United States Patent
Takahashi et al.

(10) Patent No.: US 9,633,918 B2
(45) Date of Patent: Apr. 25, 2017

(54) SEMICONDUCTOR DEVICE (71) Applicant: Mitsubishi Electric Corporation, Tokyo (JP)

(72) Inventors: Takuya Takahashi, Tokyo (JP); Yoshitaka Otsubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 328 days.

(21) Appl. No.: 14/296,778

(22) Filed: Jun. 5, 2014

(65) Prior Publication Data

US 2015/0115282 A1 Apr. 30, 2015

(30) Foreign Application Priority Data

Oct. 31, 2013 (JP) ................. 2013-226712

(51) Int. Cl.
*H01L 23/04* (2006.01)
*H01L 23/32* (2006.01)
(Continued)

(52) U.S. Cl.
CPC .............. *H01L 23/04* (2013.01); *H01L 23/32* (2013.01); *H01L 23/562* (2013.01); *H01L 24/01* (2013.01); *H01L 29/1602* (2013.01); *H01L 29/2003* (2013.01); *H01L 2224/32225* (2013.01); *H01L 2224/48091* (2013.01);
(Continued)

(58) Field of Classification Search
CPC . H01L 2224/48091; H01L 2924/13055; H01L 2924/00; H01L 2924/00014; H01L 2224/32225; H01L 2224/48472; H01L 2224/73265; H01L 23/04; H01L 23/562;
(Continued)

(56) References Cited

U.S. PATENT DOCUMENTS 5,686,758 A 11/1997 Arai et al.
5,705,853 A 1/1998 Faller et al.
(Continued)

FOREIGN PATENT DOCUMENTS

CN 101924080 A 12/2010
DE 19530264 A1 2/1997
(Continued)

OTHER PUBLICATIONS

An Office Action issued by the German Patent Office on Dec. 17, 2014, which corresponds to German Patent Application No. 10 2014 217 266.7 and is related to U.S. Appl. No. 14/296,778; with English language translation.
(Continued)

*Primary Examiner* — A. Sefer
*Assistant Examiner* — Benjamin Tzu-Hung Liu
(74) *Attorney, Agent, or Firm* — Studebaker & Brackett PC (57) ABSTRACT

A semiconductor device includes an insulating substrate, a semiconductor element secured to a top surface of the insulating substrate, a case formed of a resin and having a frame portion surrounding the semiconductor element, a metal support located above the insulating substrate and having an end secured to the frame portion, a holding-down portion extending downward from the metal support so as to prevent upwardly convex bending of the insulating substrate, and an adhesive bonding the insulating substrate and the case together.

12 Claims, 7 Drawing Sheets

(51) Int. Cl.
  *H01L 29/16* (2006.01)
  *H01L 29/20* (2006.01)
  *H01L 23/00* (2006.01)

(52) U.S. Cl.
  CPC ............... *H01L 2224/48472* (2013.01); *H01L 2224/73265* (2013.01); *H01L 2924/13055* (2013.01)

(58) Field of Classification Search
  CPC .. H01L 24/01; H01L 29/1602; H01L 29/2003
  See application file for complete search history.

(56) References Cited

U.S. PATENT DOCUMENTS

| | | | | |
|---|---|---|---|---|
| 6,294,408 | B1* | 9/2001 | Edwards | H01L 23/10 |
| | | | | 257/E23.087 |
| 8,159,822 | B2* | 4/2012 | Kanschat | H01L 23/24 |
| | | | | 165/184 |
| 2007/0194429 | A1* | 8/2007 | Lederer | H01L 24/72 |
| | | | | 257/688 |
| 2009/0102040 | A1 | 4/2009 | Specht et al. | |
| 2009/0104734 | A1 | 4/2009 | Specht et al. | |
| 2010/0252922 | A1* | 10/2010 | Bayerer | H01L 23/49562 |
| | | | | 257/692 |
| 2010/0302741 | A1 | 12/2010 | Kanschat et al. | |
| 2011/0102054 | A1* | 5/2011 | Domes | H01L 24/49 |
| | | | | 327/419 |
| 2013/0010440 | A1* | 1/2013 | Saito | H01L 23/24 |
| | | | | 361/752 |

FOREIGN PATENT DOCUMENTS

| | | |
|---|---|---|
| DE | 102008051560 A1 | 4/2009 |
| DE | 102010041892 A1 | 4/2012 |
| EP | 1843393 A2 | 10/2007 |
| JP | H07-326711 A | 12/1995 |
| JP | 2000-200865 A | 7/2000 |
| JP | 2003-303933 A | 10/2003 |
| JP | 2004-179584 A | 6/2004 |
| JP | 2008-244394 A | 10/2008 |
| JP | 2012-222173 A | 11/2012 |
| JP | 2013-135105 A | 7/2013 |
| WO | 2011/136070 A1 | 11/2011 |

OTHER PUBLICATIONS

An Office Action issued by the European Patent Office on Dec. 17, 2014, which corresponds to European Patent Application No. 10 2014 217 266.7 and is related to U.S. Appl. No. 14/296,778; with English language translation.

An Office Action; "Notification of Reason for Rejection," issued by the Japanese Patent Office on Oct. 4, 2016, which corresponds to Japanese Patent Application No. 2013-226712 and is related to U.S. Appl. No. 14/296,778; with partial English language partial translation.

An Office Action; "Notification of Reason for Rejection" issued by the Japanese Patent Office on Feb. 7, 2017, which corresponds to Japanese Patent Application No. 2013-226712 and is related to U.S. Appl. No. 14/296,778; with English language partial translation.

An Office Action issued by the Chinese Patent Office on Nov. 28, 2016, which corresponds to Chinese Patent Application No. 201410475125.X and is related to U.S. Appl. No. 14/296,778; with English language partial translation.

* cited by examiner

SEMICONDUCTOR DEVICE

BACKGROUND OF THE INVENTION

Field of the Invention

The present invention relates to a semiconductor device used, e.g., for high current control.

Background Art

Japanese Laid-Open Patent Publication No. H07-326711 discloses a semiconductor device having a baseless structure, i.e., a structure not having a baseplate or the like. In this semiconductor device, an insulating substrate is secured to the case by adhesive.

Semiconductor devices having a baseless structure have relatively low rigidity, since they do not have a baseplate or the like. Therefore, securing a semiconductor device having a baseless structure to a heat sink by means of screws, etc. sometimes results in application of a force to the insulating substrate of the semiconductor device, thereby bending the substrate into an upwardly convex shape. This upwardly convex bending may crack the insulating substrate and increase the thermal resistance between the insulating substrate and the heat sink.

SUMMARY OF THE INVENTION

The present invention has been made to solve the above problems. It is, therefore, an object of the present invention to provide a semiconductor device configured so as to minimize upwardly convex bending of its insulating substrate.

The features and advantages of the present invention may be summarized as follows.

According to one aspect of the present invention, a semiconductor device includes an insulating substrate, a semiconductor element secured to a top surface of the insulating substrate, a case formed of a resin and having a frame portion surrounding the semiconductor element, a metal support located above the insulating substrate and having an end secured to the frame portion, a holding-down portion extending downward from the metal support so as to prevent upwardly convex bending of the insulating substrate, and an adhesive bonding the insulating substrate and the case together.

Other and further objects, features and advantages of the invention will appear more fully from the following description.

DETAILED DESCRIPTION OF THE PREFERRED EMBODIMENTS

Semiconductor devices in accordance with embodiments of the present invention will be described with reference to the accompanying drawings. Throughout the specification the same or corresponding components are designated by the same reference numerals and may be described only once.

First Embodiment

Figure 1:
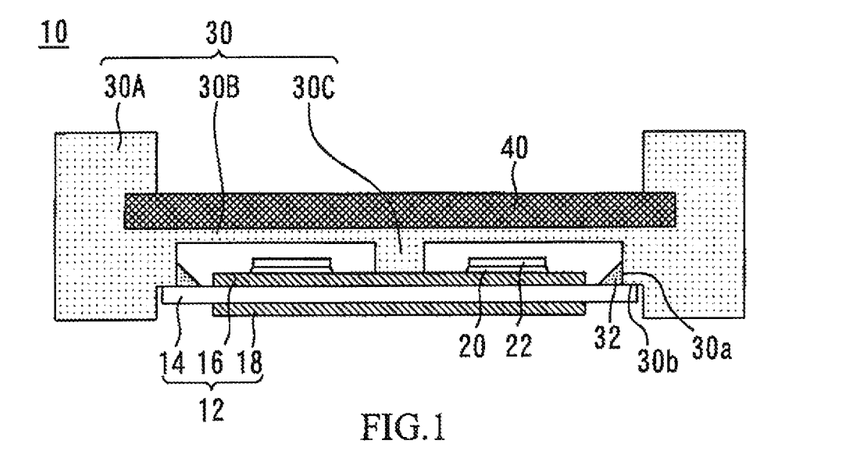
FIG. 1 is a cross-sectional view of a semiconductor device in accordance with a first embodiment of the present invention.

FIG. 1 is a cross-sectional view of a semiconductor device 10 in accordance with a first embodiment of the present invention. The semiconductor device 10 has an insulating substrate 12. The insulating substrate 12 includes a ceramic substrate 14, a metal pattern 16 formed on the top surface side of the ceramic substrate 14, and a metal film 18 formed on the bottom surface side of the ceramic substrate 14. The metal pattern 16 and the metal film 18 are formed of, e.g., aluminum. Thus, the insulating substrate 12 has aluminum coated on both surfaces of the ceramic substrate 14.

Semiconductor elements 22 are secured to the top surface of the insulating substrate 12 by solder 20. The semiconductor elements 22 may be, but are not limited to, insulated gate bipolar transistors (IGBTs) or diodes.

The semiconductor device 10 has a case 30 formed of, e.g., a polyphenylene sulfide (PPS) resin. The case 30 has a frame portion 30A, a bridge portion 30B, and a holding-down portion 30C. The frame portion 30A surrounds the semiconductor elements 22. The bridge portion 30B extends over the insulating substrate 12 from one side to the opposite side of the frame portion 30A. The holding-down portion 30C extends from the bridge portion 30B downward so as to press against the central portion of the top surface of the insulating substrate 12 and thereby prevent the insulating substrate 12 from being bent into an upwardly convex shape.

A metal support 40 is mounted on the bridge portion 30B. The metal support 40 is a copper bar. Both ends of the metal support 40 are secured into the frame portion 30A by means of, e.g., insert molding. That is, both ends of the metal support 40 are embedded into the frame portion 30A. The metal support 40 is located above the insulating substrate 12.

Figure 2:
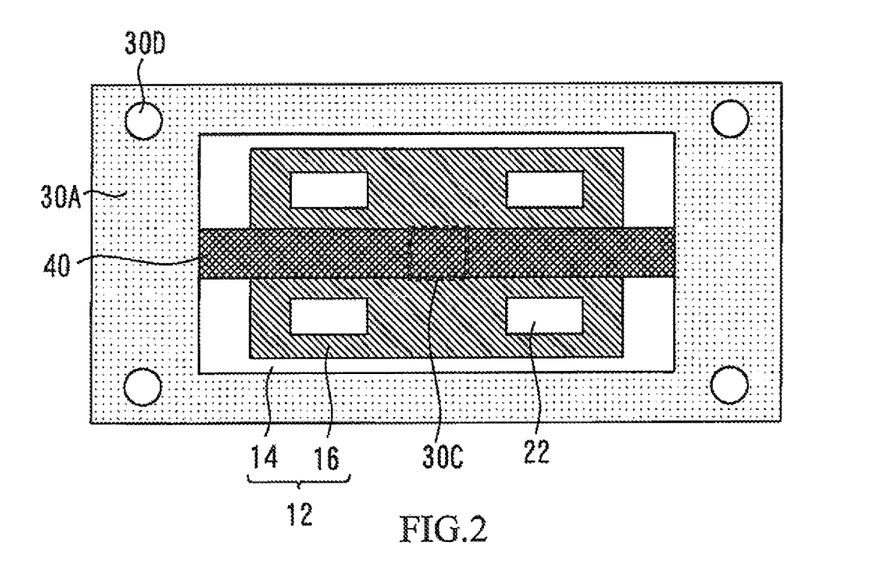
FIG. 2 is a plan view of the semiconductor device.

FIG. 2 is a plan view of the semiconductor device 10. As shown, a through-hole 30D is formed in each of the four corners of the frame portion 30A of the case 30. The metal support 40 extends over the central portion of the insulating substrate 12. The holding-down portion 30C is located directly above the central portion of the insulating substrate 12, as indicated by the dashed line in FIG. 2.

Figure 3:
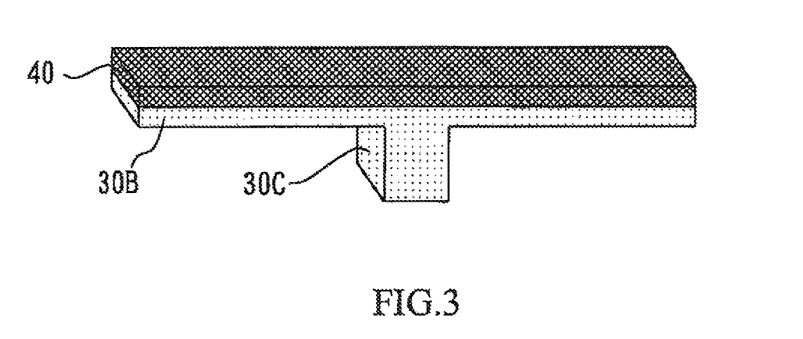
FIG. 3 is a perspective view of the metal support, etc.

FIG. 3 is a perspective view of the metal support 40, etc. The metal support 40 is located directly above the bridge portion 30B and the holding-down portion 30C. The holding-down portion 30C extends downward away from the metal support 40 and is prevented by the metal support 40 from being displaced upward.

Referring back to FIG. 1, the insulating substrate 12 is bonded to the case 30 by adhesive 32. Specifically, the ceramic substrate 14 of the insulating substrate 12 is bonded to the inner side 30a of the frame portion 30A of the case 30 by the adhesive 32, with the edge of the ceramic substrate 14 being in contact with an inner step portion 30b of the case 30.

Figure 4:
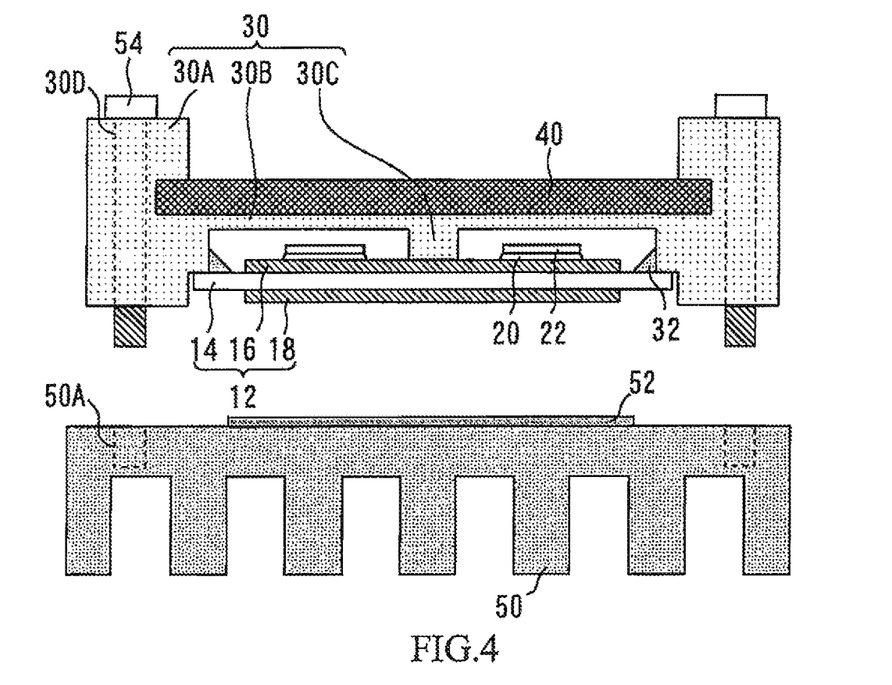
FIG. 4 is a diagram showing the way in which the semiconductor device is secured to a heat sink.

FIG. 4 is a diagram showing the way in which the semiconductor device 10 is secured to a heat sink 50. The surface of the heat sink 50 is coated with a thermal grease 52. Further, screw holes 50A are formed in the heat sink 50. Screws 54 are passed through the through-holes 30D and screwed into the screw holes 50A. As a result, the metal film 18 of the semiconductor device 10 is brought into contact with the heat sink 50 with the thermal grease 52 interposed therebetween. In this way the semiconductor device 10 of the first embodiment is secured to the heat sink 50.

When a conventional semiconductor device of the type described herein is secured to the heat sink 50 by screws, the case 30 may deform due to force resulting from tightening the screws and, as a result, the insulating substrate 12 may be bent into an upwardly convex shape. In the case of the semiconductor device 10 of the first embodiment, on the other hand, the holding-down portion 30C, which is a novel feature of the present invention, prevents upwardly convex bending of the insulating substrate 12 since the holding-down portion 30C presses the central portion of the insulating substrate 12 downward. Furthermore, the metal support 40 disposed on the holding-down portion 30C prevents the holding-down portion 30C from being displaced upward due to the reaction force caused by the compression force on the insulating substrate 12. This means that the insulating substrate 12 is reliably prevented from being bent into an upwardly convex shape.

Further, it should be noted that there is a difference in the coefficients of thermal expansion of the components of the semiconductor device 10. Therefore, if it were not for the holding-down portion 30C, the insulating substrate 12 would be vertically displaced due to changes in the temperature of the semiconductor device 10 resulting from changes in the power of the device, resulting in tensile stress being applied to the solder 20. This may cause the solder 20 to crack. In the semiconductor device 10 of the first embodiment, the presence of the holding-down portion 30C prevents displacement of the insulating substrate 12 and hence prevents cracking of the solder 20. Further, the prevention of displacement of the insulating substrate 12 also prevents the thermal grease 52 (or other heat dissipation material) from being pumped out from between the insulating substrate 12 and the heat sink 50.

In the first embodiment, the metal support 40 is formed of copper and the case 30 is formed of a PPS resin, meaning that the coefficient of thermal expansion of the metal support 40 is substantially equal to that of the case 30. Therefore, the metal support 40 and the case 30 are unlikely to deform due to the difference in their coefficients of thermal expansion. This also helps prevent displacement of the insulating substrate 12.

It should be noted that since the metal pattern 16 and metal film 18 of the insulating substrate 12 are formed of aluminum, the insulating substrate 12 has low rigidity, as compared to cases where the metal pattern 16 and the metal film 18 are formed of copper. Since the insulating substrate 12 has only low rigidity, the holding-down portion 30C and the metal support 40 need not be highly rigid in order to prevent bending or warping of the insulating substrate 12. Therefore, the holding-down portion 30C and the metal support 40 may be formed of a material having a relatively low rigidity, meaning that a wider variety of materials are available. Further, the holding-down portion 30C and the metal support 40 may be reduced in thickness or width in order to reduce their cost.

The metal support 40 may have any configuration that prevents upwardly convex bending of the insulating substrate 12. For example, the metal support 40 may be a flat plate, or alternatively it may have a cross-like configuration. In the latter case, the four ends of the metal support may be secured to the frame portion 30A. Further, the center portion of the cross-like metal support may be disposed directly above the holding-down portion 30C to effectively prevent upwardly convex bending of the insulating substrate 12.

The holding-down portion 30C is preferably configured to be in contact with the insulating substrate 12 in order to prevent upwardly convex bending of the insulating substrate 12. However, even if there is a slight gap between the holding-down portion 30C and the insulating substrate 12, the holding-down portion 30C serves to prevent the insulating substrate 12 from being significantly bent into an upwardly convex shape. Therefore, the present invention does not necessarily require that the holding-down portion 30C be in contact with the insulating substrate 12.

Although the semiconductor elements 22 are typically formed of silicon, they may be formed of a wide bandgap semiconductor having a wider bandgap than silicon. Examples of wide bandgap semiconductors include silicon carbide, gallium nitride-based materials, and diamond. Semiconductor elements formed of a wide bandgap semiconductor generate greater heat than those formed of silicon, at high current densities. This means that if the semiconductor elements 22 of the semiconductor device 10 are formed of a wide bandgap semiconductor, there is a greater risk of the insulating substrate 12 being bent. However, even in such cases, the holding-down portion 30C prevents bending of the insulating substrate 12. Various other alterations may be made to the semiconductor device of the first embodiment while retaining the above features of the invention. It should be noted that such alterations may also be made to the semiconductor devices of the subsequently described embodiments.

The semiconductor devices of the following embodiments of the invention have many features common to the semiconductor device 10 of the first embodiment. Therefore, the description of these semiconductor devices will be primarily limited to the differences from the semiconductor device 10.

Second Embodiment

Figure 5:
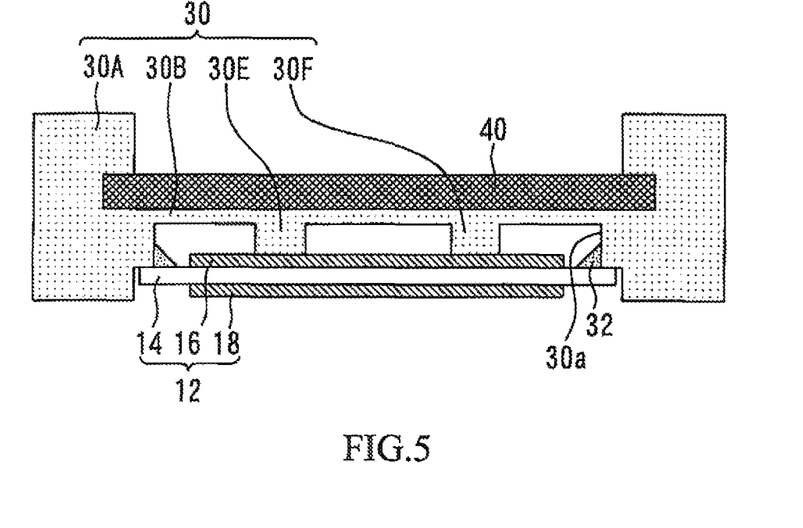
FIG. 5 is a cross-sectional view of a semiconductor device in accordance with a second embodiment of the present invention.

FIG. 5 is a cross-sectional view of a semiconductor device in accordance with a second embodiment of the present invention. This semiconductor device has a holding-down portion 30E and a holding-down portion 30F instead of the holding-down portion 30C of the first embodiment. The holding-down portions 30E and 30F are configured to be in contact with the insulating substrate 12, thereby preventing the insulating substrate 12 from being bent into an upwardly convex shape. The presence of a plurality of holding-down portions (in this case, two holding-down portions) makes it possible to reliably prevent upwardly convex bending of the insulating substrate 12.

It should be noted that when the insulating substrate 12 is bent into an upwardly convex shape, the displacement of the central portion of the insulating substrate 12 is greater than that of the other portions of the insulating substrate 12. This is the reason why, in the first embodiment, the holding-down portion 30C is disposed to press against the central portion of the insulating substrate 12. However, any suitable portion or portions of the insulating substrate 12 may be held down to prevent upwardly convex bending of the insulating substrate 12. In the second embodiment, the holding-down portions 30E and 30F are disposed to press against the insulating substrate 12 at portions other than the central portion. Further, any number of holding-down portions may be provided.

Third Embodiment

Figure 6:
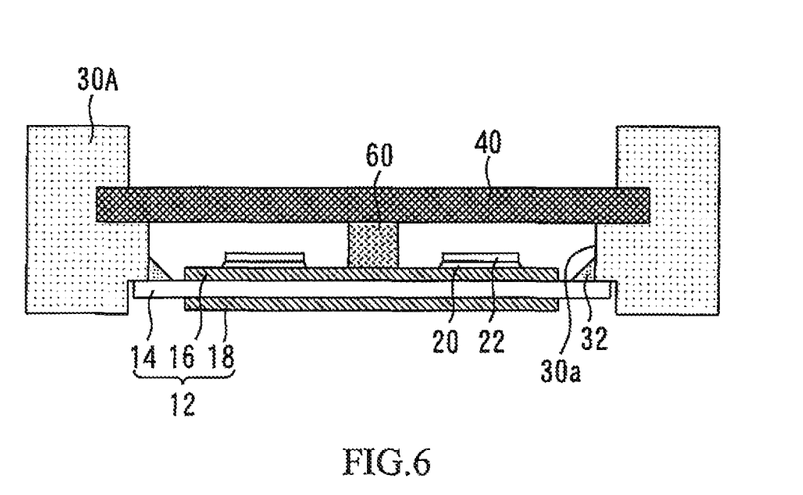
FIG. 6 is a cross-sectional view of a semiconductor device in accordance with a third embodiment of the present invention.

FIG. 6 is a cross-sectional view of a semiconductor device in accordance with a third embodiment of the present invention. This semiconductor device has a holding-down portion 60 instead of the holding-down portion 30C of the first embodiment. The holding-down portion 60 is formed of an elastic material such as rubber. The holding-down portion 60 and the case 30 are separate components. The holding-down portion 60 prevents the insulating substrate 12 from being significantly bent into an upwardly convex shape. When the force bending the insulating substrate 12 into an upwardly convex shape is extremely strong, the insulating substrate 12 may crack if the displacement of the insulating substrate 12 is completely restrained by a nonelastic holding-down portion. In the second embodiment, the elastic holding-down portion 60 allows slight bending of the insulating substrate 12, thereby preventing cracking of the insulating substrate 12.

Fourth Embodiment

Figure 7:
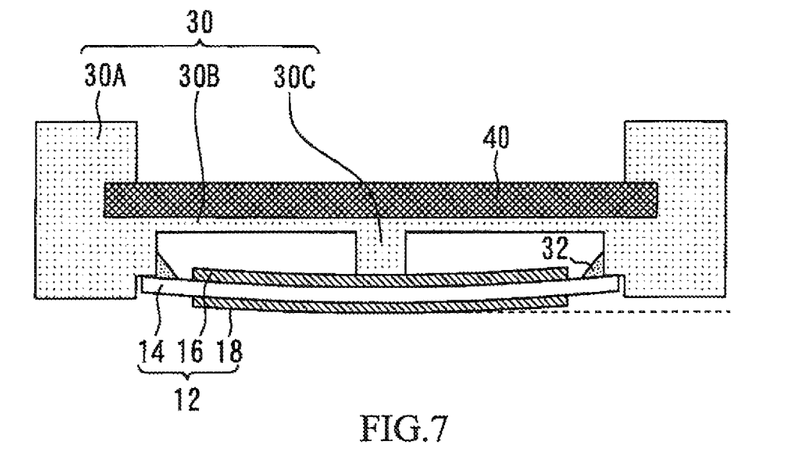
FIG. 7 is a cross-sectional view of a semiconductor device in accordance with a fourth embodiment of the present invention.

FIG. 7 is a cross-sectional view of a semiconductor device in accordance with a fourth embodiment of the present invention. In this semiconductor device, the insulating substrate 12 is pressed downward and bent into a downwardly convex shape by the holding-down portion 30C. The bottom surface of the insulating substrate 12 is at a lower level than the bottom surface of the case 30.

Figure 8:
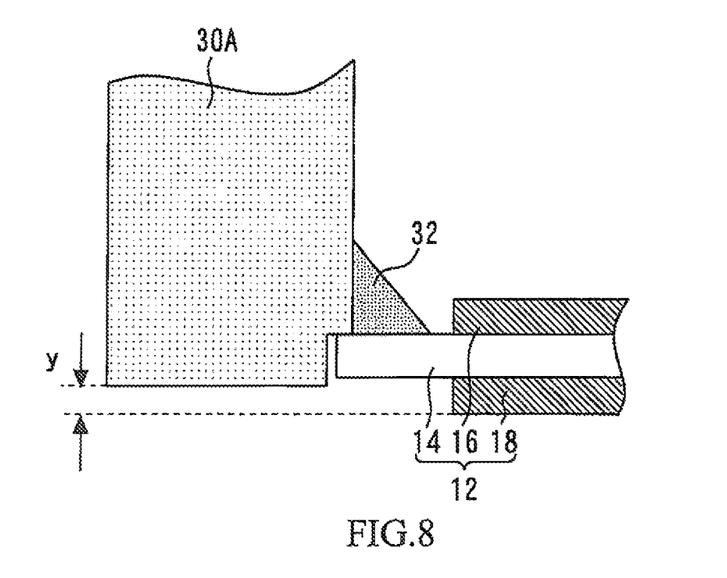
FIG. 8 is a cross-sectional view of a portion of a partially completed semiconductor device in accordance with the fourth embodiment.

A method of manufacturing the semiconductor device in accordance with the fourth embodiment will be described. FIG. 8 is a cross-sectional view of a portion of a partially completed semiconductor device in accordance with the fourth embodiment after the adhesive 32 has been applied to adjacent portions of the insulating substrate 12 and the case 30, but before the adhesive 32 is thermally hardened to bond the insulating substrate 12 and the case 30 together. As shown, the bottom surface of the insulating substrate 12 is vertically spaced a distance y below the bottom surface of the case 30.

Figure 9:
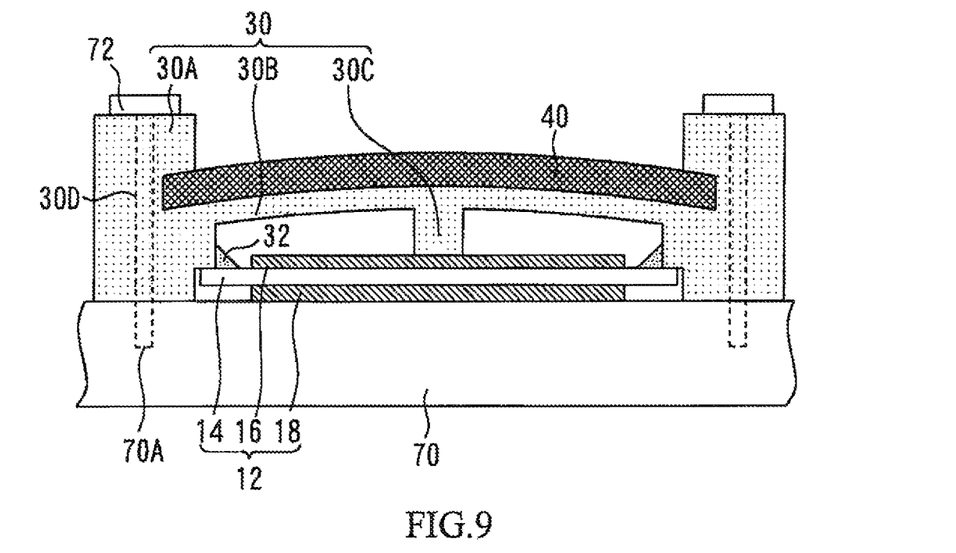
FIG. 9 shows a step of thermally hardening the adhesive.

With reference to FIG. 9, the following description will be directed to the step of thermally hardening the adhesive 32. This step uses a cure baseplate 70 with screw holes 70A. First, screws 72 are passed through the through-holes 30D of the case 30 and screwed into the screw holes 70A to secure the semiconductor device to the cure baseplate 70. As a result, the bottom surface of the insulating substrate 12 is brought level with the bottom surface of the case 30, and the metal support 40 is bent into an upwardly convex shape.

The adhesive 32 is then thermally hardened by applying heat through the cure baseplate 70 to the insulating substrate 12, thereby bonding the insulating substrate 12 and the case 30 together. The screws 72 are then loosened to remove the semiconductor device from the cure baseplate 70. As a result, the holding-down portion 30C is displaced downward by the restoring force of the elastic metal support 40, so that the holding-down portion 30C presses the insulating substrate 12 downward and thereby bends it into a downwardly convex shape.

It should be noted that upwardly convex bending of the insulating substrate 12 results in a decrease in the surface area of contact and hence an increase in the thermal resistance between the insulating substrate 12 and the heat sink 50. In order to avoid this, the semiconductor device of the fourth embodiment is configured in such a manner that the insulating substrate 12 is bent into a downwardly convex shape by the holding-down portion 30C, as described above, so that the thermal resistance between the insulating substrate 12 and the heat sink 50 is maintained relatively low.

Fifth Embodiment

Figure 10:
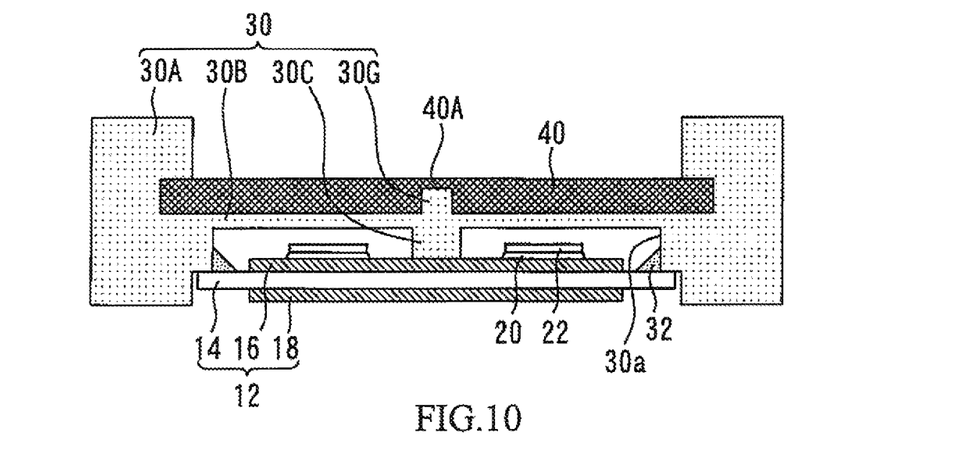
FIG. 10 is a cross-sectional view of a semiconductor device in accordance with a fifth embodiment of the present invention.

FIG. 10 is a cross-sectional view of a semiconductor device in accordance with a fifth embodiment of the present invention. The metal support 40 of this semiconductor device has a recess 40A. The recess 40A is filled with a resin 30G which is a part of the case 30. The resin 30G may be formed by insert molding. Since the recess 40A of the metal support 40 is filled with the resin 30G of the case 30, the surface area of contact between the metal support 40 and the case 30 is greater than otherwise would be the case. Further, this makes it possible to increase the rigidity of the holding-down portion 30C of the case 30 and thereby reliably prevent upwardly convex bending of the insulating substrate 12.

Sixth Embodiment

Figure 11:
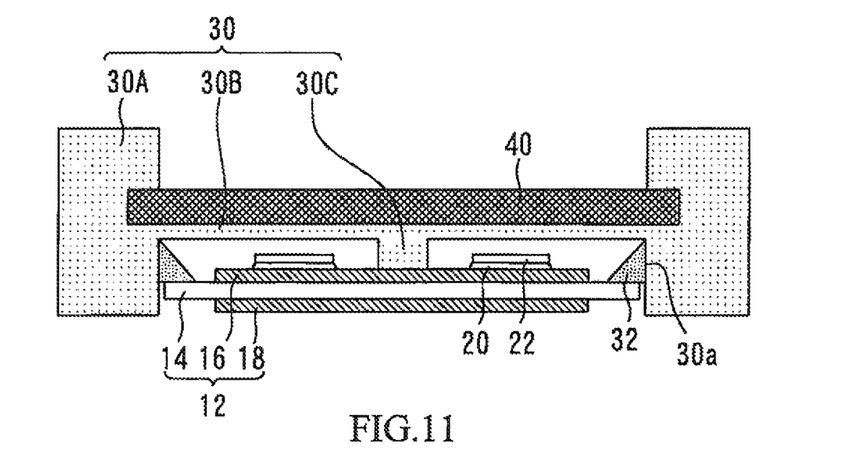
FIG. 11 is cross-sectional view of a semiconductor device in accordance with a sixth embodiment of the present invention.

FIG. 11 is a cross-sectional view of a semiconductor device in accordance with a sixth embodiment of the present invention. In this semiconductor device, the insulating substrate 12 is not in direct contact with the frame portion 30A of the case 30; the adhesive 32 is interposed between the insulating substrate 12 and the frame portion 30A. Since the circumferential edge of the insulating substrate 12 is in contact with and is held by only the adhesive 32, which has a lower Young's modulus than the case 30, the stress applied to the insulating substrate 12 resulting from displacement is relatively low, thus reducing the risk of cracking the insulating substrate 12.

Seventh Embodiment

Figure 12:
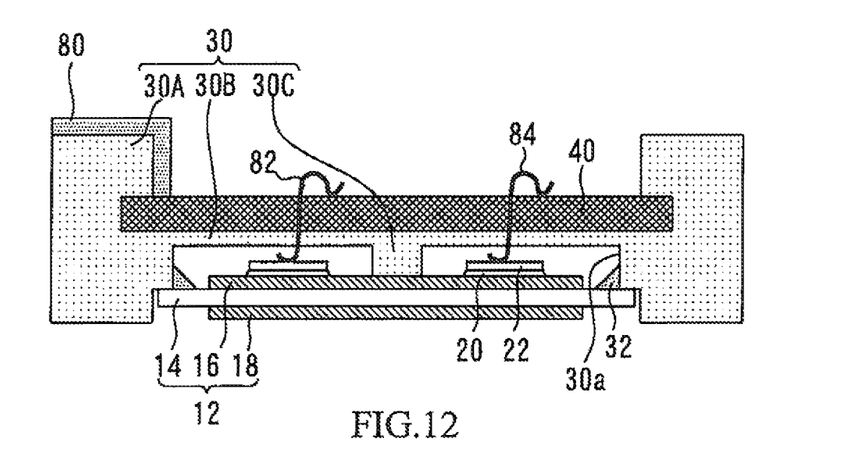
FIG. 12 is a cross-sectional view of a semiconductor device in accordance with a seventh embodiment of the present invention.

FIG. 12 is a cross-sectional view of a semiconductor device in accordance with a seventh embodiment of the present invention. This semiconductor device includes an electrode 80 connected to the metal support 40. (It should be noted that in an alternative embodiment the metal support 40 and the electrode 80 may be integrally formed of the same material.) The metal support 40 is connected to the semiconductor elements 22 by wires 82 and 84. Thus, the metal support 40 serves as an electrode of the semiconductor elements 22, as well as serving to hold the holding-down portion 30C in position. The use of the metal support 40 in this way makes it possible to improve the component mounting density of the semiconductor device and thereby effectively utilize the space therein, allowing a reduction in the size of the semiconductor device.

Eighth Embodiment

Figure 13:
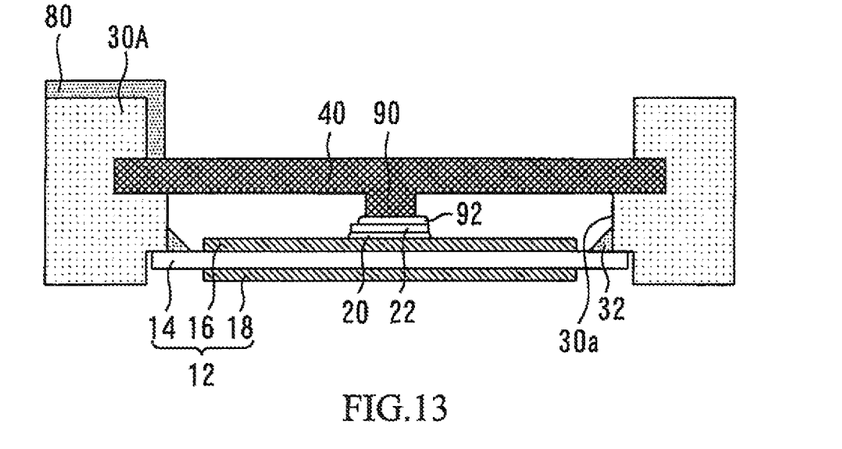
FIG. 13 is a cross-sectional view of a semiconductor device in accordance with an eighth embodiment of the present invention.

FIG. 13 is a cross-sectional view of a semiconductor device in accordance with an eighth embodiment of the present invention. This semiconductor device has a holding-down portion 90 instead of the holding-down portion 30C of the first embodiment. The holding-down portion 90 is formed of a metal and integrally with the metal support 40 and is secured to an electrode of a semiconductor element 22 by solder 92. This eliminates the need to connect an electrode 80 (see FIG. 14) to the semiconductor device 22 by means of a wire, etc., resulting in reduced manufacturing cost. It should be noted that the electrode 80, the metal support 40, and the holding-down portion 90 may be integrally formed together of a metal in order to further reduce manufacturing costs.

Ninth Embodiment

Figure 14:
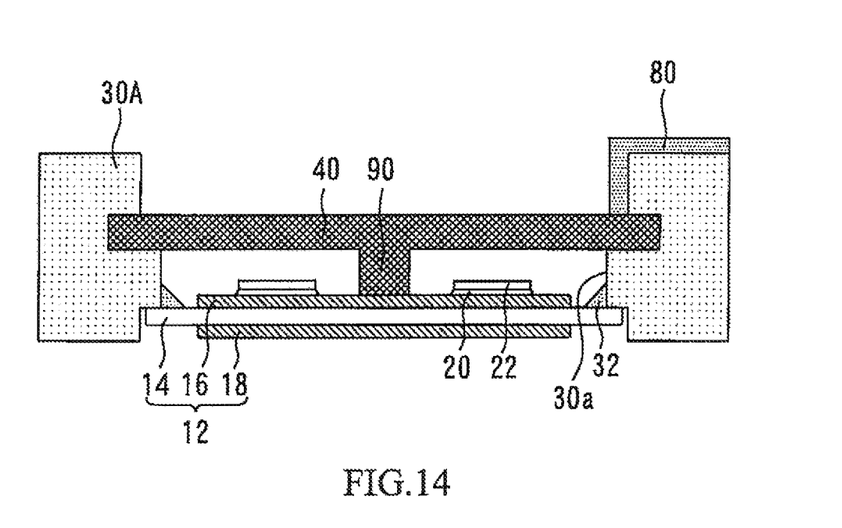
FIG. 14 is a cross-sectional view of a semiconductor device in accordance with a ninth embodiment of the present invention.

FIG. 14 is a cross-sectional view of a semiconductor device in accordance with a ninth embodiment of the present invention. This semiconductor device has a holding-down portion 90 instead of the holding-down portion 30C of the first embodiment. The holding-down portion 90 is formed of a metal and integrally with the metal support 40 and secured to the metal pattern 16, which is electrically connected to the bottom surface electrodes of the semiconductor devices 22. The holding-down portion 90 is maintained in contact with the metal pattern 16 by the stress of the holding-down portion 90 and/or by the force applied to bend the insulating substrate 12 into an upwardly convex shape, without using solder. It should be noted that solder may be used to reliably secure the holding-down portion 90 to the metal pattern 16.

The configuration of the semiconductor device of the ninth embodiment eliminates the need that the electrode 80 connected to the metal support 40 be connected to the metal pattern 16 by means of a wire, etc., resulting in reduced manufacturing cost. It should be noted that the electrode 80, the metal support 40, and the holding-down portion 90 may be integrally formed together of a metal in order to further reduce manufacturing costs.

The insulating substrate 12 has greater resistance to breaking than the semiconductor elements 22. This means that the semiconductor device of the ninth embodiment (in which the holding-down portion 90 is secured to the insulating substrate 12) has an advantage over the semiconductor device of the eighth embodiment (in which the holding-down portion 90 is secured to an semiconductor element 22), since the holding-down portion 90 can be pressed against the insulating substrate 12 with a greater force than against the semiconductor elements 22. Therefore, in the semiconductor device of the ninth embodiment, the insulating substrate 12 is more reliably prevented from displacement, as compared to the semiconductor device of the eighth embodiment.

It should be noted that features of the semiconductor devices of embodiments described above may be combined where appropriate.

Thus, the semiconductor device of the present invention has a holding-down portion which prevents upward displacement of the insulating substrate of the semiconductor device, thereby minimizing upwardly convex bending of the insulating substrate.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
an insulating substrate;
a semiconductor element secured to a top surface of said insulating substrate;
a case formed of a resin and having a frame portion surrounding said semiconductor element;
a metal support located above said insulating substrate and having an end secured to said frame portion;
a holding-down portion extending downward from said metal support so as to prevent upwardly convex bending of said insulating substrate; and
an adhesive bonding said insulating substrate and said case together, wherein
said insulating substrate is pressed downward and thereby bent into a downwardly convex shape by said holding-down portion, and a bottom surface of said insulating substrate is located at a lower level than a bottom surface of said case.

2. The semiconductor device according to claim 1, further comprising a plurality of said holding-down portions.

3. The semiconductor device according to claim 1, wherein said holding-down portion is formed of an elastic material.

4. The semiconductor device according to claim 1, wherein said metal support is formed of copper, and said resin is a PPS resin.

5. The semiconductor device according to claim 1, wherein said insulating substrate is not in direct contact with said frame portion, and said adhesive is interposed between said insulating substrate and said frame portion.

6. The semiconductor device according to claim 1, wherein said metal support serves as an electrode of said semiconductor element.

7. The semiconductor device according to claim 6, wherein said holding-down portion is formed of a metal and integrally with said metal support and is secured to an electrode of said semiconductor element.

8. The semiconductor device according to claim 6, wherein said holding-down portion is formed of a metal and integrally with said metal support, said insulating substrate has a ceramic substrate and a metal pattern formed on a top surface side of said ceramic substrate, and said holding-down portion is secured to said metal pattern.

9. The semiconductor device according to claim 1, wherein said insulating substrate includes a ceramic substrate and aluminum coated on both surfaces of said ceramic substrate.

10. The semiconductor device according to claim 1, wherein said semiconductor element is formed of a wide bandgap semiconductor.

11. The semiconductor device according to claim 10, wherein said wide bandgap semiconductor is silicon carbide, a gallium nitride-based material, or diamond.

12. A semiconductor device comprising:
an insulating substrate;
a semiconductor element secured to a top surface of said insulating substrate;
a case formed of a resin and having a frame portion surrounding said semiconductor element;
a metal support located above said insulating substrate and having an end secured to said frame portion;

a holding-down portion extending downward from said metal support so as to prevent upwardly convex bending of said insulating substrate; and an adhesive bonding said insulating substrate and said case together, wherein said metal support has a recess filled with resin material of said case.

* * * * *